United States Patent

Tsai et al.

[11] Patent Number: 5,930,644
[45] Date of Patent: Jul. 27, 1999

[54] METHOD OF FORMING A SHALLOW TRENCH ISOLATION USING OXIDE SLOPE ETCHING

[75] Inventors: Chia-Shiung Tsai, Hsinchu; Kuei-Ying Lee, Kaohsiung; Hun-Jan Tao, Hsinchu, all of Taiwan

[73] Assignee: Taiwan Semiconductor Manufacturing Co., Ltd., Hsinchu, Taiwan

[21] Appl. No.: 08/898,791

[22] Filed: Jul. 23, 1997

[51] Int. Cl.$^6$ ................................................ H01L 21/76
[52] U.S. Cl. ..................... 438/424; 438/701; 438/713; 438/691
[58] Field of Search ......................... 438/248, 259, 438/402, 412, 424, 427, 435, 437, 448, 756, 701, 713, 735–739, 743; 430/311

[56] References Cited

U.S. PATENT DOCUMENTS

| | | | |
|---|---|---|---|
| 3,839,111 | 10/1974 | Ham et al. | 438/756 |
| 4,376,672 | 3/1983 | Wang et al. | 438/713 |
| 4,696,095 | 9/1987 | Thomas | 438/424 |
| 5,310,457 | 5/1994 | Ziger | 438/448 |
| 5,509,995 | 4/1996 | Park | 438/713 |
| 5,578,519 | 11/1996 | Cho | 438/424 |
| 5,580,700 | 12/1996 | Rahman | 430/311 |
| 5,665,635 | 9/1997 | Kwon et al. | 438/427 |
| 5,753,418 | 5/1998 | Tsai et al. | 438/713 |
| 5,786,262 | 7/1998 | Jang et al. | 438/435 |
| 5,811,345 | 9/1998 | Yu et al. | 438/424 |

Primary Examiner—Olik Chaudhuri
Assistant Examiner—Anh D. Mai
Attorney, Agent, or Firm—Christensen O'Connor Johnson & Kindness PLLC

[57] ABSTRACT

A new method for planarizing a shallow trench isolation is disclosed by using a polysilicon layer or bottom anti-reflective coating (BARC) to form a reverse tone with a taper profile. The formation of the shallow trench isolation described includes a pad layer, and a silicon nitride layer formed-on a semiconductor wafer. Trenches are created by photolithography and dry etching processes. An oxide layer is formed in the trenches for the purpose of isolation. A polysilicon layer or bottom anti-reflective coating is subsequently formed on the oxide layer. A plurality of openings are generated in the polysilicon or the BARC layer. An etching is used to etch the oxide layer, thereby forming a reverse tone having a taper profile. A Chemical Mechanical Polishing is performed to planarize the surface of a semiconductor wafer.

19 Claims, 3 Drawing Sheets

METHOD OF FORMING A SHALLOW TRENCH ISOLATION USING OXIDE SLOPE ETCHING

FIELD OF THE INVENTION

The present invention relates to a method of forming isolation between devices in integrated circuits (IC) and, more specifically, to a method of fabricating a shallow trench isolation for a semiconductor device.

BACKGROUND OF THE INVENTION

Shallow trench isolations present another formidable challenge in the manufacturing of semiconductor chips as the devices approach even smaller submicron ranges. The manufacturing of a semiconductor chip starts with forming a single device on a silicon substrate and isolating the single device from other devices. These individual devices are electrically interconnected through a selected conductive path. The interconnections of these devices are constructed to form the desire circuit functions on a semiconductor chip.

At present, several types of isolation techniques have been proposed, such as LOCOS (LOCal Oxidation of Silicon), LOCOS-base isolation, and shallow trench isolation (STI). A trench isolation is used primarily for isolating devices in VLSI and ULSI, and hence they replace conventional LOCOS isolation techniques. As device geometry reaches submicron size, conventional LOCOS isolation techniques limits the capability to manufacture devices at these small dimensions. For example, the conventional LOCOS structure and shape cause unacceptably large encroachment of the field oxide into the device active regions. Further, the topography of the LOCOS is inadequate for submicron devices. Thus, shallow trench isolation is gaining popularity for quarter-micron technology. In the basic shallow trench isolation (STI) technology, shallow trenches are anisotropically etched into the silicon substrate. A CVD oxide is deposited onto the substrate and is then planarized by CMP (Chemical Mechanical Polishing) or etching back.

One of the problems associated with the formation of STI is dishing effect on a wide trench region. The dishing effect degrades the planarity of a layer, and impacts the control of implantation during the implantation process. In order to overcome this problem during the formation of a shallow trench isolation, a plurality of protrudent portions of the silicon oxide 4 are generated over the trench region 2. This structure is referred to as "reverse tone", as shown in FIG. 1. The protruded portions eliminate the dishing problem from the fast removing rate of the CMP performed over the trench in comparison to the neighboring regions.

However, conventional methods may cause damage of the reverse tone that occurs in misalignment during the formation of the reverse tone. Turning to FIG. 2, a photoresist 6 is patterned on the oxide layer 4 used to form the reverse tone. Since the photoresist 6 is misaligned, a portion of the reverse tone is etched. A portion of the oxide 4 in the trench for isolation is then removed using the photoresist 6 as a mask. The oxide 4 may fail to serve as sufficient isolations between devices. In ULSI, a tiny amount of leakage per device can induce significant power dissipation to the overall circuit.

SUMMARY OF THE INVENTION

A silicon dioxide layer forms on a semiconductor wafer to serve as a pad layer. A silicon nitride layer is then deposited on the pad layer to serve as a stop layer for subsequent chemical mechanical polishing (CMP). A shallow trench is generated by using a dry etching technique. An oxide layer is refilled into the trench and formed on the silicon nitride layer for isolation. A polysilicon layer or bottom anti-reflective layer is then formed on the silicon nitride layer. A plurality of opening is generated in the polysilicon layer or bottom anti-reflective layer. The oxide layer is then etched to form the reverse tone. The polysilicon layer is etched laterally during the oxide layer etch. The openings of the polysilicon layer are widen and a portion of oxide layer is then exposed. Apertures with taper profile are created in the oxide. A residual protruded portion of oxide remains over the trench. Subsequently, a chemical mechanical polishing (CMP) technique is used to remove the oxide layer on the surface of the silicon nitride layer for planarization.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed to manufacture shallow trench isolations (STI) in a substrate by using an oxide slope etching. An oxide layer used to refill into a trench and used to form the reverse tone is etched with a slope profile to overcome the problem associated with misalignment during the formation of the reverse tone. A thin polysilicon layer or a bottom anti-reflective coating (BARC) is used in order to provide high etching selectivity with the oxide. As will be seen below, these techniques can be used for improving the performance of the shallow trench isolations.

Figure 1:
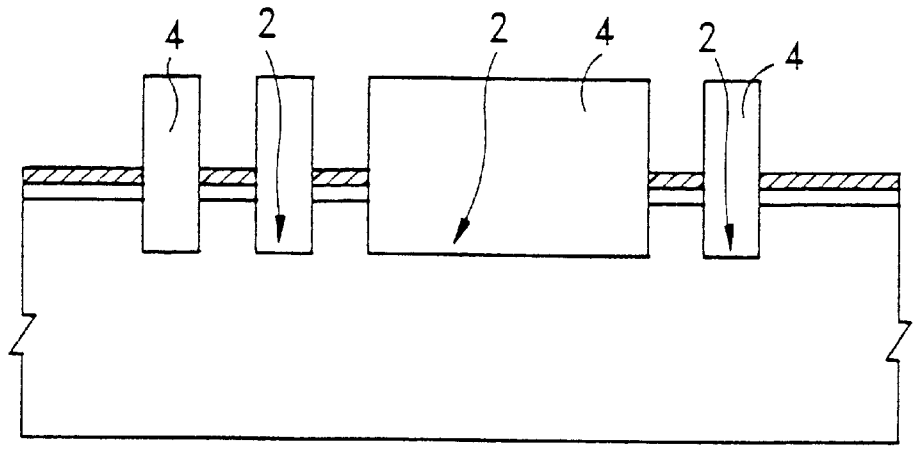
FIG. 1 is a cross sectional view of a semiconductor wafer illustrating a reverse tone structure for forming trench isolation in accordance with prior art.
Figure 2:
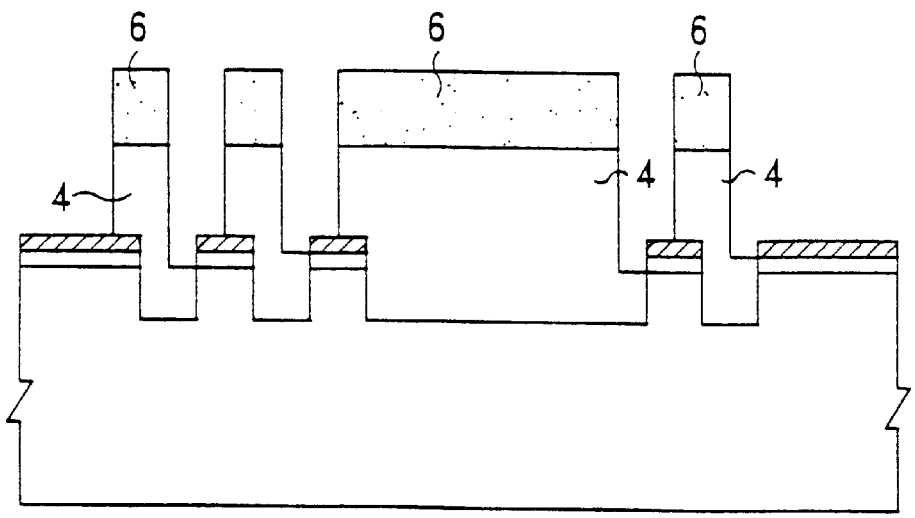
FIG. 2 is a cross sectional view of a semiconductor wafer illustrating a portion of the oxide used to form the reverse tone that are etched due to misalignment.
Figure 3:
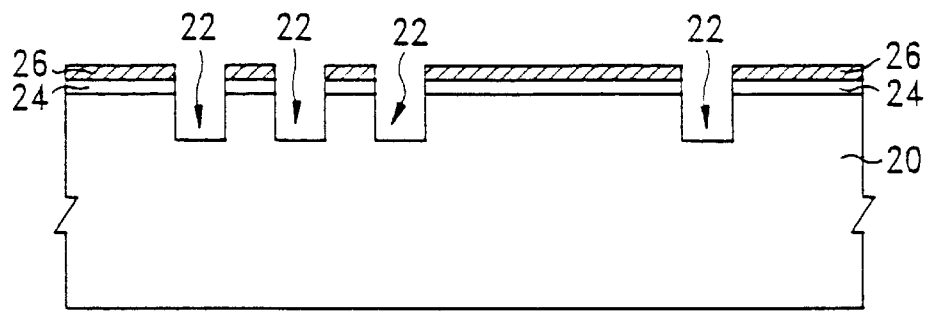
FIG. 3 is a cross sectional view of a semiconductor wafer illustrating the step of forming trenches in a wafer in accordance with the present invention.

Referring to FIG. 3, in the preferred embodiment a silicon wafer 20 is a p-type silicon with <100> crystallographic orientation. Trenches 22 are generated in a conventional manner. A silicon oxide layer 24 is formed on the wafer followed by depositing a silicon nitride layer 26. In one embodiment, the silicon oxide layer 24 is formed on the wafer 20 to serve as a pad layer. The silicon oxide 24 is typically formed by using a thermal oxidation in an oxygen ambient at a temperature of about 800–1100. Alternatively, the oxide layer 24 may be formed using any suitable oxide chemical compositions and procedures. The silicon nitride layer 26 is deposited on the silicon oxide layer 24 to serve as a stop layer for subsequent chemical mechanical polishing (CMP). The silicon nitride layer 26 can be deposited by any suitable process, including Low Pressure Chemical Vapor Deposition (LPCVD), Plasma Enhance Chemical Vapor Deposition (PECVD), and High Density Plasma Chemical Vapor Deposition (HDPCVD). The thickness of the silicon nitride layer is about 1500 to 1800 angstroms. The reaction gases used to form the silicon nitride layer 26, for example, include SiH4, NH3, N2, N2O or SiH2Cl2, NH3, N2, N2O.

A photoresist is patterned on the silicon nitride layer 26 to define shallow trench isolation regions. By using the photoresist as an etching mask, an etching is then used to etch the silicon nitride layer 26, the silicon oxide layer 24 and the wafer 20. A plurality of shallow trenches 22 are formed by this step. The depth of the shallow trenches 22 typically are about 2000 to 8000 angstroms from the surface of the silicon nitride layer 26. The photoresist is removed after the trenches 22 are formed. Well known wet clean process is then used to clean the wafer 20.

Figure 4:
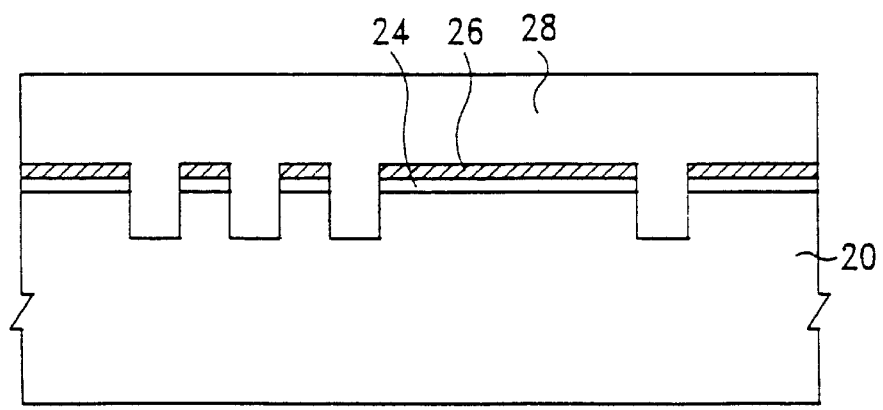
FIG. 4 is a cross sectional view of a semiconductor wafer illustrating the steps of forming an oxide layer in the trenches in accordance with the present invention.

As shown in FIG. 4, an oxide layer 28 is deposited on the surfaces of the silicon nitride layer 26 and refill in to the trenches 22. The oxide layer 28 is preferably formed by using chemical vapor deposition. The thickness of the oxide layer 28 is in the range of about 5000 to 8000 angstroms. The oxide layer 28 serves as a trench filling layer for isolation. The preferred trench filling materials include lining oxide, plasma enhance oxide or subatmospheric chemical vapor deposition oxide. Alternatively, an ozone-TEOS layer can be used to refill into the trenches 22 isolation. The thickness of the lining oxide is about 350 angstroms while the temperature of the reaction is about 920° C. If the PE-oxide serves as the trench filing material, then the thickness ranges from 450 to 500 angstroms, whereas the SACVD oxide is about 6500 angstroms. Preferably, the ozone-TEOS layer is formed at a temperature in the range of about 400 to 480° C. A thermal process is carried out to density the trench filling layer 28 at a temperature about 950 to 1050° C. for 30 to 130 minutes.

Figure 5:
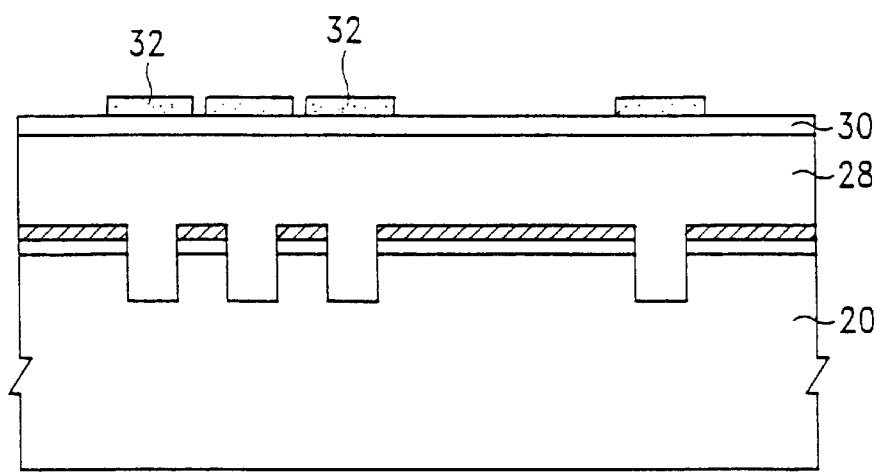
FIG. 5 is a cross sectional view of a semiconductor wafer illustrating the step of forming a mask layer on the oxide layer.

Turning to FIG. 5, a polysilicon layer 30 or an organic BARC layer 30 is formed on the surface of the oxide layer 28. The oxide layer 28 has a highly selective etching to the polysilicon layer 30. By controlling the etching recipe, the oxide layer 28 can be substantially removed by an etching. Subsequently, a photoresist 32 is patterned on the BARC layer 30 to define the reverse tone region.

Figure 6:
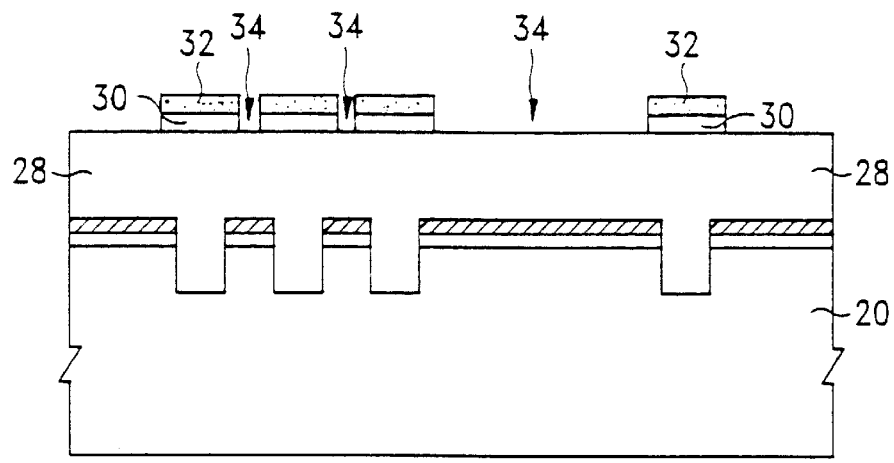
FIG. 6 is a cross sectional view of a semiconductor wafer illustrating the step of forming openings in the mask layer.

Referring next to FIG. 6, an etching is performed by etching the BARC 30 to form openings 34 in the polysilicon layer or BARC 30 extending to the surface of the oxide layer 28. The width of each individual portion of the layer 30 between the openings 34 is wider than the width of the each trench 22 formed under and aligned to the aforementioned individual portion of the layer 30. The etched layer 30 is used as a mask for subsequent etching. The thickness of the polysilicon layer (or BARC) 30 is about 500 to 1500 angstroms. Typically, the BARC 30 is etched by using $O_2/N_2/CF_4$ as the etchant. If the polysilicon is used, then the polysilicon layer is generally etched by $CF_4/CHF_3$.

Figure 7:
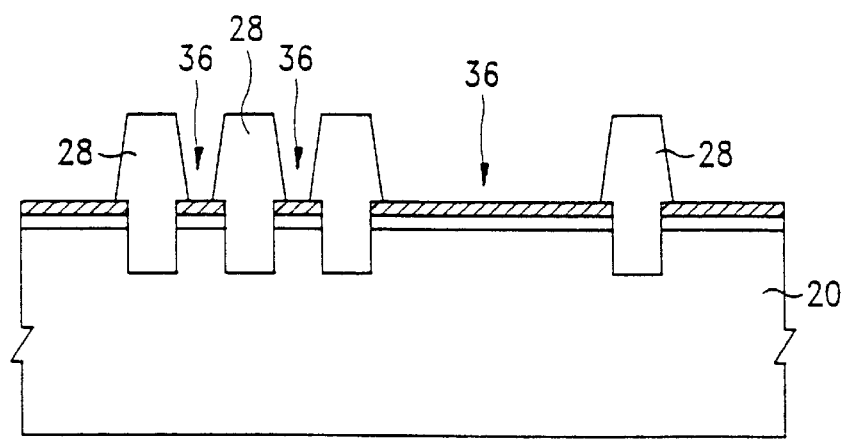
FIG. 7 is a cross sectional view of a semiconductor wafer illustrating the step of forming reverse tone on the trenches.

Turning to FIG. 7, a wet etching is subsequently performed using the photoresist 32 as a mask to etch the trench filling layer 28. In the preferred embodiment, the etchant of the etching is selected from diluted HF or buffer oxide etching. Apparently, the silicon oxide layer 28 covered by the photoresist 32 will be protected. Moreover, the reverse tone is formed with taper profile after the etching. The polysilicon layer (or BARC) 30 and the oxide layer 28 is etched to form a mask layer. The polysilicon layer 30 is etched laterally during the oxide layer 28 etch. But the etching rate of the oxide layer 28 is faster than that of the layer 30. Therefore, the openings 34 of the polysilicon layer 30 are wider and a portion of oxide layer 28 is then exposed when the opening is widen. The exposed portion of the oxide layer is then etched. Apertures 36 with taper profile are created in the oxide 28. The resulting structure is called a reverse tone. The magnitude of the taper is related to the thickness of the oxide layer 28. Even if the misalignment occurs, the reverse tone forms over and aligned to the trench from the apertures 36 with taper profile. Thus, the present invention upgrades the tolerance of misalignment for forming the shallow trench isolation. In the present invention, the misalignment problem will be eliminated. Thus, a plurality of protruded portions of trench filling layer 28 remain over the trenches 22. Therefore, the photoresist and the layer 30 are respectively stripped away.

Figure 8:
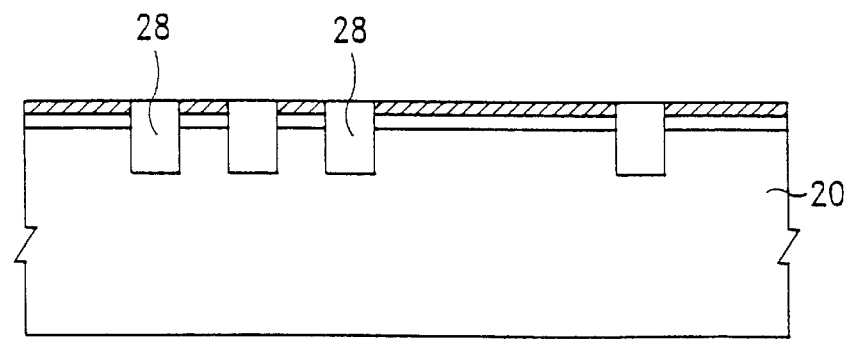
FIG. 8 is a cross sectional view of a semiconductor wafer illustrating the step of performing a CMP process for planarization.

Referring to FIG. 8, a chemical mechanical polishing (CMP) technique is subsequently used to remove the trench filling layer 28 to the surface of the silicon nitride layer 26 for planarization. The silicon nitride layer 26 and the pad oxide layer 24 are respectively removed using conventional techniques such as using a hot phosphorous acid, where the pad oxide 24 is removed using HF solution.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a shallow trench isolation on a wafer, said method comprising the following steps of:

forming a pad layer on said wafer;

forming a silicon nitride layer on said pad layer;

forming a plurality of trenches by etching said silicon nitride layer, said pad layer and said silicon wafer;

forming a trench filling layer for isolation on said silicon nitride layer and refilling into said trenches;

forming a mask layer on said trench filling layer;

forming a plurality of openings in said mask layer and extending to a surface of said trench filling layer; and etching said trench filling layer using said mask layer as a mask, wherein the etching rate of said trench filling layer is faster than that of said mask layer, said mask layer being laterally etched during etching said trench filling layer, thereby forming a plurality of apertures having a taper profile, a residual protruded trench filling layer remaining over said trenches; and removing said mask layer.

2. The method of claim 1, further comprising a step of planarizing said trench filling layer by using chemical mechanical polishing to the surface of said silicon nitride layer after removing said mask layer.

3. The method of claim 2, further comprising a step of performing a thermal annealing for densification after forming said trench filling layer.

4. The method of claim 1, further comprising a step of performing a thermal annealing for densification after forming said trench filling layer.

5. The method of claim 1, further comprising the steps of forming said shallow trench:

patterning a photoresist on said silicon nitride layer to define trench regions; and etching said silicon nitride layer, said pad layer and said silicon wafer by using said photoresist as a mask; and removing said photoresist.

6. The method of claim 1, wherein said trench filling layer is selected from a group consisting of a lining oxide layer, a plasma-enhance-oxide layer, a sub-atmospheric-chemical-vapor-deposition (SACVD) oxide layer and an ozone-TEOS layer.

7. The method of claim 1, wherein said mask layer comprises a polysilicon layer.

8. The method of claim 1, wherein said mask layer comprises a bottom anti-reflective coating layer.

9. The method of claim 1, wherein said mask layer is formed to have a thickness of about 500 to 1500 angstroms.

10. The method of claim 6, wherein said ozone-TEOS layer is formed at a temperature in the range of about 400 to 480° C.

11. The method of claim 6, wherein the thickness of said lining oxide layer is about 350 angstroms.

12. The method of claim 6, wherein the thickness of said PE-oxide layer is about 450–500 angstroms.

13. The method of claim 6, wherein the thickness of said SACVD oxide layer is about 6500 angstroms.

14. The method of claim 1, wherein said trench filling layer is etched by diluted HF.

15. The method of claim 1, wherein said silicon nitride layer is formed by a method selected from a group consisting of Low Pressure Chemical Vapor Deposition, Plasma Enhance Chemical Vapor Deposition and High Density Plasma Chemical Vapor Deposition.

16. The method of claim 15, wherein the reaction gases of forming said silicon nitride layer comprises $SiH_2Cl_2$, $NH_3$, $N_2$, and $N_2O$.

17. The method of claim 15, wherein the reaction gases of forming said silicon nitride layer comprises $SiH_4$, $NH_3$, $N_2$, and $N_2O$.

18. The method of claim 15, wherein a temperature of forming said silicon nitride layer is about 400°–800° C.

19. The method of claim 3, wherein said thermal annealing is carried out at a temperature of about 950 to 1050 ° C., for about 30 to 130 minutes.

* * * * *

UNITED STATES PATENT AND TRADEMARK OFFICE
CERTIFICATE OF CORRECTION

PATENT NO. : 5,930,644
DATED : July 27, 1999
INVENTOR(S) : C.-S. Tsai et al.

It is certified that error appears in the above-identified patent and that said Letters Patent is hereby corrected as shown below:

| COLUMN | LINE | |
|---|---|---|
| [57] Pg. 1, col. 2 | Abstract line 6 of text | "formed-on" should read --formed on-- |
| 5 (Claim 6, | 18-19 lines 3-4) | "sub-atmospheric-chemical-vapor-deposition (SACVD) oxide layer" should read --sub-atmospheric-chemical-vapor-deposition-oxide layer-- |

Signed and Sealed this
First Day of February, 2000

Attest:

Attesting Officer

Q. TODD DICKINSON
Acting Commissioner of Patents and Trademarks